United States Patent
Xu

(10) Patent No.: US 9,530,845 B2
(45) Date of Patent: Dec. 27, 2016

(54) FREQUENCY MULTIPLIER BASED ON A LOW DIMENSIONAL SEMICONDUCTOR STRUCTURE

(71) Applicant: SOUTH CHINA NORMAL UNIVERSITY, Guangzhou (CN)

(72) Inventor: Kunyuan Xu, Guangzhou (CN)

(73) Assignee: SOUTH CHINA NORMAL UNIVERSITY (CN)

( * ) Notice: Subject to any disclaimer, the term of this patent is extended or adjusted under 35 U.S.C. 154(b) by 0 days.

(21) Appl. No.: 14/767,301

(22) PCT Filed: Mar. 25, 2014

(86) PCT No.: PCT/CN2014/073996
§ 371 (c)(1),
(2) Date: Aug. 12, 2015

(87) PCT Pub. No.: WO2014/173218
PCT Pub. Date: Oct. 30, 2014

(65) Prior Publication Data
US 2016/0035837 A1   Feb. 4, 2016

(30) Foreign Application Priority Data

Apr. 23, 2013 (CN) .......................... 2013 1 0144245

(51) Int. Cl.
*H01L 29/66* (2006.01)
*H01L 29/20* (2006.01)
(Continued)

(52) U.S. Cl.
CPC ......... *H01L 29/2003* (2013.01); *H01L 29/778* (2013.01); *H03B 19/14* (2013.01)

(58) Field of Classification Search
CPC ..... H01L 29/2003; H01L 29/778; H03B 19/14
See application file for complete search history.

(56) References Cited

U.S. PATENT DOCUMENTS 5,148,242 A * 9/1992 Tsukaka ............... H01L 29/772
257/192
5,385,865 A * 1/1995 Nieder .................. B82Y 10/00
257/E21.408
(Continued)

FOREIGN PATENT DOCUMENTS

CN      1669144 A    9/2005
CN    101431106 A    5/2009
(Continued)

OTHER PUBLICATIONS

International Search Report; PCT/CN2014/073996; International Filing Date: Mar. 25, 2014, 4 pgs.
(Continued)

*Primary Examiner* — John C Ingham
*Assistant Examiner* — Frederick B Hargrove
(74) *Attorney, Agent, or Firm* — Schmeiser, Olsen & Watts, LLP

(57) ABSTRACT

A frequency multiplier based on a low dimensional semiconductor structure, including an insulating substrate layer, a semiconductor conducting layer arranged on the surface of the insulating substrate layer, an insulating protective layer arranged on the surface of the semiconductor conducting layer, an insulating carving groove penetrating the semiconductor conducting layer, an inlet electrode arranged on the side surface of the semiconductor conducting layer, and an outlet electrode arranged on the side surface corresponding to the access electrode is provided. The semiconductor conducting layer comprises two two-dimensional, quasi-one-dimensional, or one-dimensional current carrying channels near to and parallel to each other. The frequency multiplier has advantages that the structure is simple, the process is easy to implement, no extra filter circuit needs to (Continued)

be added, dependence on material characteristics is little, and the selection range of materials is wide.

9 Claims, 4 Drawing Sheets

(51) Int. Cl.
*H03B 19/14* (2006.01)
*H01L 29/778* (2006.01)

(56) References Cited

U.S. PATENT DOCUMENTS

| | | | |
|---|---|---|---|
| 5,569,355 A | 10/1996 | Then et al. | |
| 2008/0130356 A1 | 6/2008 | Song | |
| 2009/0045438 A1* | 2/2009 | Inoue | H01L 29/155 |
| | | | 257/192 |
| 2009/0283756 A1* | 11/2009 | Hellings | H01L 29/0843 |
| | | | 257/24 |
| 2011/0068853 A1* | 3/2011 | Worschech | G01R 33/06 |
| | | | 327/510 |

FOREIGN PATENT DOCUMENTS

| | | |
|---|---|---|
| CN | 102904528 A | 1/2013 |
| CN | 103219944 A | 7/2013 |

OTHER PUBLICATIONS

J. Jan-olof and J. Wesström, "Self-Gating Effect in the Electron Y-Branch Switch", Phys. Rev. Lett. 82, 2564 (1999).
H. Wang, D. Nezich, J. Kong and T. Palacios, "Graphene frequency multipliers", IEEE Electron Device Letters 30, 547 (2009).

* cited by examiner

FREQUENCY MULTIPLIER BASED ON A LOW DIMENSIONAL SEMICONDUCTOR STRUCTURE

CROSS-REFERENCE TO RELATED APPLICATIONS

This application claims priority to PCT Application No. PCT/CN2014/073996, having a filing date of Mar. 25, 2014, based on CN 201310144245.7, having a filing date of Apr. 23, 2013, the entire contents of which are hereby incorporated by reference.

FIELD OF TECHNOLOGY

The following relates to a frequency multiplier based on a low dimensional semiconductor structure, in particular to a frequency multiplier which needs no additional filter circuit and can work at terahertz frequencies at room temperature.

BACKGROUND

As semiconductor technology is developing continuously, the characteristic lengths of devices have constantly reduced from micron to the current nanometer scale; and, the corresponding material system structures used have also changed from the traditional higher dimensions (three-dimensions) to lower dimensions (two-dimensions, quasi-one-dimension and one-dimension). Devices based on the low dimensional semiconductor structure usually have a simple process, are easy to integrate, and small in stray capacitance, and therefore are taken as an ideal choice for high-frequency devices.

Besides, in comparison with the three-dimensional conductive structures, low dimensional conductive structure's shielding effects on the electric field are greatly reduced, which results in strong electric field distribution around the conductive structure and increased electric field coupling among the conductive structures. Due to this characteristic of the low dimensional conductive structure, a so-called "self-gating effect" appears in the "Y" shaped planar nano-switch (J. Jan-olof and J. Wesström, "Self-Gating Effect in the Electron Y-Branch Switch", Phys. Rev. Lett. 82, 2564 (1999)).

Frequency multiplying technology is always an essential constitutive part of wireless communication and broadcasting technology. With the rapid development of science and technology, frequency multiplying technology is becoming more and more important. At present, various fields such as digital communication, analog communication, radio astronomy, and terahertz science technologies all have huge demands on frequency multiplying technology. Non-linear elements will result in distortion in waveform of the input signals. According to the Fourier transform theory, the frequency ingredients of the output signal will change. This is the well-known physical basis of the generation of frequency multiplication. At present, non-linear frequency multipliers mainly includes two major types: frequency multipliers based on diodes, and those based on field effect transistors. Those frequency multipliers have a common feature that the output signal includes various frequency ingredients, thus additional filter circuits are needed.

MIT researchers published the first frequency multiplier which consists of a single field effect transistor and needs no additional filter circuit (H. Wang, D. Nezich, J. Kong and T. Palacios, "Graphene frequency multipliers", IEEE Electron Device Letters 30, 547 (2009)). This frequency multiplier is also based on the non-linear feature of the field effect transistor, but the material for manufacturing the field effect transistor is not a traditional material, but a novel material with unique electric properties—graphene. The field effect transistor made from this novel material has a special "V" type current-voltage characteristics such that the output signals only contain the second harmonics of the input signal, thus a single graphene field effect transistor can be manufactured into the frequency multiplier without an additional filter circuit.

The above publication from the MIT researchers greatly reduces the circuits of the frequency multiplier, however, this invention is based on the unique electric properties of the manufacturing material, which means that this invention is strongly material depended and cannot be achieved by using other material systems.

SUMMARY

Provided is a frequency multiplier based on a low dimensional semiconductor structure which hardly depends on the material characteristics and needs no additional filter circuit so as to overcome the defects in the prior art.

To fulfill the above, the following technical solution is employed:

A frequency multiplier based on a low dimensional semiconductor structure, comprising an insulating substrate layer, a semiconductor conducting layer arranged on the surface of the insulating substrate layer, an insulating conducting layer arranged on the surface of the semiconductor conducting layer, an insulating carving groove penetrating the semiconductor conducting layer, an inlet electrode arranged on a side surface of the semiconductor conducting layer and an outlet electrode arranged on the other side surface corresponding to the inlet electrode. The semiconductor conducting layer comprises two two-dimensional, quasi-one-dimensional, or one-dimensional current carrying channels close to and parallel to each other.

Furthermore, the space between the two current carrying channels is less than 1 μm.

Furthermore, the dielectric constant of the insulating protective layer is higher than that of the semiconductor conducting layer.

Furthermore, when the current carrying channels are quasi-one-dimensional, the insulating carving groove comprises a first insulating carving groove and a second insulating carving groove which are symmetrically arranged and a third insulating carving groove arranged between the first insulating carving groove and the second insulating carving groove; one end of the first insulating carving groove, one end of the second insulating carving groove, and one end of the third insulating carving groove respectively extend to a side surface of the conducting layer; the inlet electrode and the outlet electrode are respectively arranged on opposite surfaces of the conducting layer; the said inlet electrode comprises a first inlet electrode arranged on the side surface of the conducting layer area surrounded by the first insulating carving groove and the third insulating carving groove, and the second inlet electrode arranged on the conducting layer area surrounded by the second insulating carving groove and the third insulating carving groove and on the same side of surface where the first inlet electrode is located.

Furthermore, the semiconductor conducting layer is of AlGaAs/InGaAs heterojunction, which comprises an InGaAs layer, an AlGaAs layer, and a δ doping area arranged in the AlGaAs layer to result in a two-dimensional electron gas layer between the AlGaAs layer and the InGaAs layer.

Furthermore, the semiconductor conducting layer is of AlGaAs/InGaAs heterojunction, which comprises an InGaAs layer, an AlGaAs layer, and a δ doping area arranged in the AlGaN layer to result in a two-dimensional electron gas layer between the AlGaN layer and the GaN layer.

Furthermore, the dielectric constant of the third insulating carving groove is higher than that of the semiconductor conducting layer.

Furthermore, when the current carrying channels are two-dimensional, an insulating interval layer and a second semiconductor conducting layer are also arranged in turn between the insulating protective layer and the semiconductor conducting layer; the said structure of the frequency multiplier comprises the insulating substrate layer, the semiconductor conducting layer, the insulating interval layer, the second semiconductor conducting layer, and the insulating protective layer in sequence from the bottom to the surface.

Furthermore, one end of the semiconductor conducting layer bends and extends to the bottom surface of the insulating substrate layer; one end of the second semiconductor conducting layer bends and extends to the surface of the insulating protective layer; the bending part of the semiconductor conducting layer is opposite to that of the second semiconductor conducting layer; the said inlet electrode comprises the first inlet electrode which is arranged on the bottom surface of the insulating substrate layer and connected with the bending part of the semiconductor conducting layer and the second inlet electrode arranged on the surface of the insulating protective layer and connected with the bending part of the second semiconductor conducting layer; the said outlet electrode is connected with the insulating protective layer, the second semiconductor conducting layer, the insulating interval layer, the semiconductor conducting layer, and the insulation protective layer.

The disclosed frequency multiplier has the following beneficial effects:

1. It is simple in structure, easy for implement of process, and needs no extra filter circuit.
2. It hardly depends on the material characteristics, so the materials can be selected in a wide scope, including various inorganic and organic semiconductors and novel nano-semiconductor materials, carbon nano-tubes, or graphene.
3. It can work at room temperature at a high frequency. Appropriately selected materials can make it work in terahertz frequency region at room temperature.

BRIEF DESCRIPTION

Some of the embodiments will be described in detail, with reference to the following figures, wherein like designations denote like members, wherein.

Marks: 11—first insulating carving groove; 12—second insulating carving groove; 13—third insulating carving groove;

14—first current carrying channel; 15—second current carrying channel; 16—first low resistance area;

17—second low resistance area; 18—third low resistance area;

21—first inlet electrode; 22—second inlet electrode; 23—outlet electrode;

3—two-dimensional conducting layer; 31—AlGaN layer; 32—GaN layer; 33—two-dimensional electron gas layer; 311—doping area;

34—insulating protective layer; 35—insulating substrate layer;

41—first insulating carving groove; 42—second insulating carving groove; 43—first current carrying channel; 44—second current carrying channel;

45—first low resistance area; 46—second low resistance area;

51—first inlet electrode; 52—second inlet electrode; 53—outlet electrode;

61—insulating substrate layer; 62—semiconductor conducting layer; 63—insulating interval layer; 64—second semiconductor conducting layer;

65—insulating protective layer.

DETAILED DESCRIPTION

The present invention is described in detail below with reference to the attached drawings and embodiments. The embodiments and description of the present invention is intending to explain the present invention, and do not limit the present invention.

Figure 1:
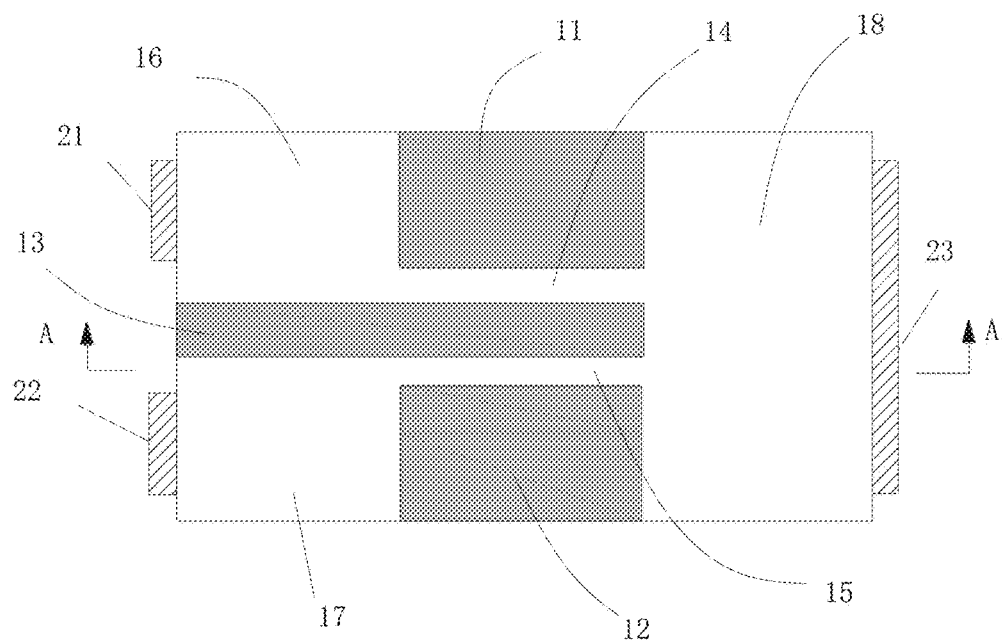
FIG. 1 is a schematic view of a surface of a frequency multiplier with quasi-one-dimensional current carrying channels in the first embodiment.

Embodiment 1: Referring to FIG. 1, this is a top plan view of the frequency multiplier based on a low dimensional semiconductor structure in this embodiment, omitting the insulating protective layer. Thus, a first insulating carving groove 11, a second insulating carving groove 12, a third insulating carving groove 13, a first inlet electrode 21, a second inlet electrode 22, and a outlet electrode 23 are visible. The third insulating carving groove 13 is inserted between the first insulating carving groove 11 and the second insulating carving groove 12. The first insulating carving groove 11 and the second insulating carving groove 12 are arranged in an opposite position. The space between the first insulating carving groove 11 and the third insulating carving groove 13 forms the first current carrying channel 14; the space between the second insulating carving groove 12 and the third insulating carving groove 13 forms the second current carrying channel 15. The area surrounded by the first insulating carving groove 11 and the third insulating carving groove 13 is the first low resistance area 16; the area surrounded by the second insulating carving groove 12 and the third insulating carving groove 13 is the second low resistance area 17; and the part of the semiconductor conducting layer excluding the first resistance area 16, the second resistance area 17, the first current carrying channel 14, and the second current carrying channel 15, is the third low resistance area 18. The insulating carving grooves can be formed by dry etching. The minimum depth requirement of the insulating carving groove is penetrating the two-dimensional conducting layer 3.

The first inlet electrode 21 is arranged on the side surface of the first low resistance area 16, and the surface of which is perpendicular to the plane where the first current carrying channel 14 is located. The second inlet electrode 22 is arranged on the side surface of the second low resistance area 17, and the surface of which is perpendicular to the plane where the second current carrying channel 15 is located. The outlet electrode 23 is arranged on a side surface of the third low resistance area 18, and the side surface is perpendicular to the plane where the first current carrying channel 14 or the second current carrying channel 15 is located. Therefore, the first inlet electrode 21, the second inlet electrode 22 and the outlet electrode 23 are respectively arranged on the opposite sides of the semiconductor conducting layer. The input signals are respectively input from the first inlet electrode 21 and the second inlet electrode 22, pass through the first low resistance area 16 and the second low resistance area 17, the first current carrying channel 14 and the second current carrying channel 15, and the third low resistance area 18, and then are output from the outlet electrode 23.

To make sure that the electric characteristics of the frequency multiplier can be adjusted and controlled by the external electric field, the current carrying channels are made from semiconductor materials. Furthermore, in order to utilize the "self-gating effect" to enable the coupling between the current carrying channels, the current carrying channels are employing two-dimensional, quasi-one-dimensional, or one-dimensional structure which is of low dimension. In this embodiment, the semiconductor material employs one-dimensional structure which is of low dimension. Wherein, the first current carrying channel 14 and the second current carrying channel 15 are parallel to each other, at an interval of 100 nm~1.0 µm. The self-gating effect is an effect of nano scale, referring to that when the current carrying channels get close, the lateral electric field caused by potential difference between the current carrying channels can change the carrying property of the current carriers, whose effect is similar to the role of the gate of a field effect transistor, only the gate does not actually exist.

Figure 2:
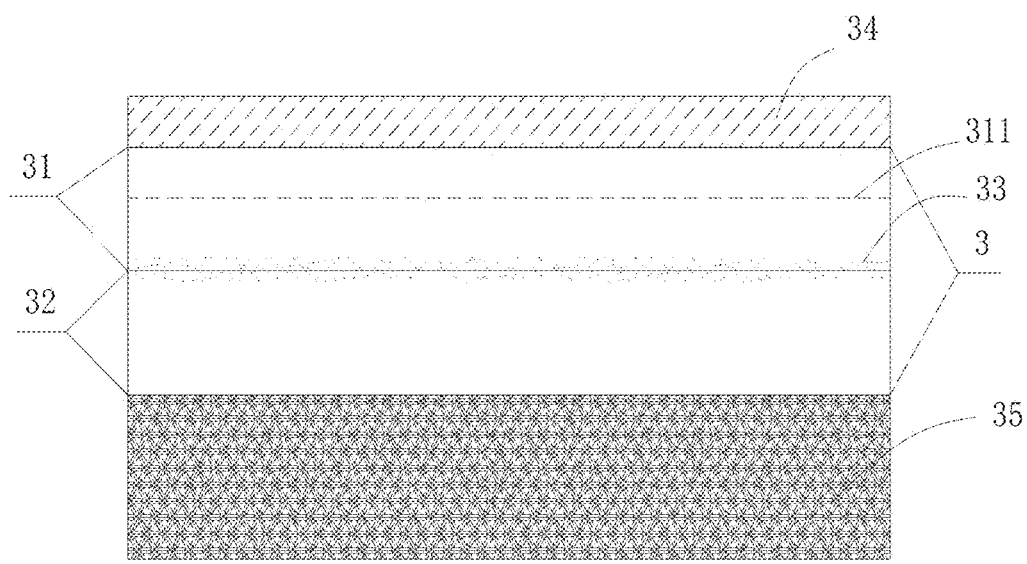
FIG. 2 is a sectional view taken along line A-A of FIG. 1.

Referring to FIG. 2, this is a sectional view taken along line A-A of FIG. 1. In this embodiment, the frequency multiplier comprises an insulating substrate layer 35, a semiconductor conducting layer 3 arranged on the surface of the insulating substrate layer, and an insulating protective layer 34 arranged on the surface of the semiconductor conducting layer. The said first insulating carving groove 11, the second insulating carving groove 12 and the third insulating carving groove 13 penetrate the semiconductor conducting layer 3. Furthermore, the dielectric constant of the third insulating carving groove 13 is higher than the dielectric constant of the semiconductor conducting layer 3. The insulating protective layer 18 has a high dielectric constant, which is higher than that of the semiconductor conducting layer 3. The insulating material with the high dielectric constant can play the role of strengthening the mutual coupling of the current carrying channels, so a good signal output curve can be obtained even if the space between the current carrying channels is greater than 1 µm.

Furthermore, the semiconductor conducting layer is of AlGaN/GaN heterojunction, which comprises an AlGaN layer, a GaN layer and a two-dimensional electron gas layer formed between the AlGaN layer and the GaN layer. The GAN is able to form a two-dimensional electron gas layer due to its self-polarization effect.

Furthermore, the semiconductor conducting layer is of AlGaAs/InGaAs heterojunction, which comprises an InGaAs layer, an AlGaAs layer, and a δ doping area arranged in the AlGaAs layer to result in a two-dimensional electron gas layer between the AlGaAs layer and the InGaAs layer. The doping area plays the role of importing the two-dimensional electron gas.

Figure 3:
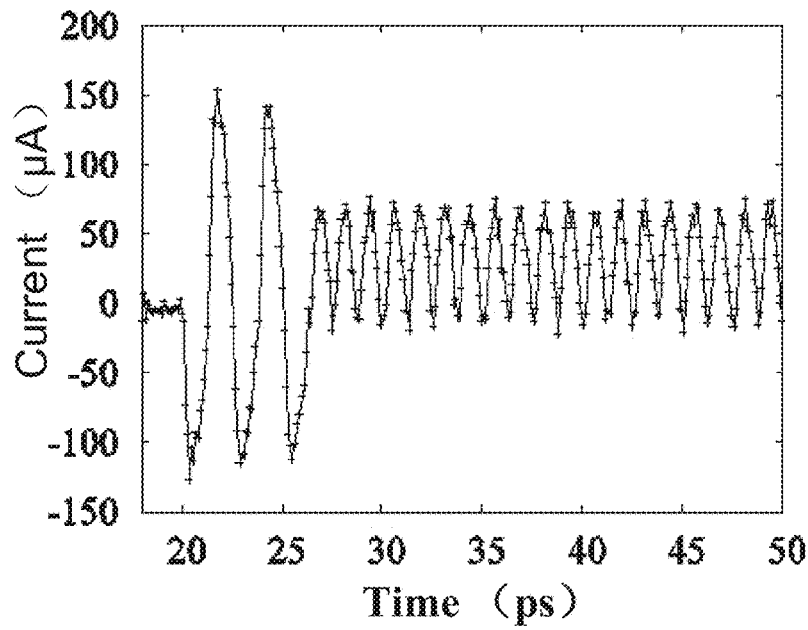
FIG. 3 is an output characteristic curve graph under the effect of two high-frequency signals when the current carrying channels are quasi-one-dimensional, obtained in the Monte-Carlo simulation.
Figure 4:
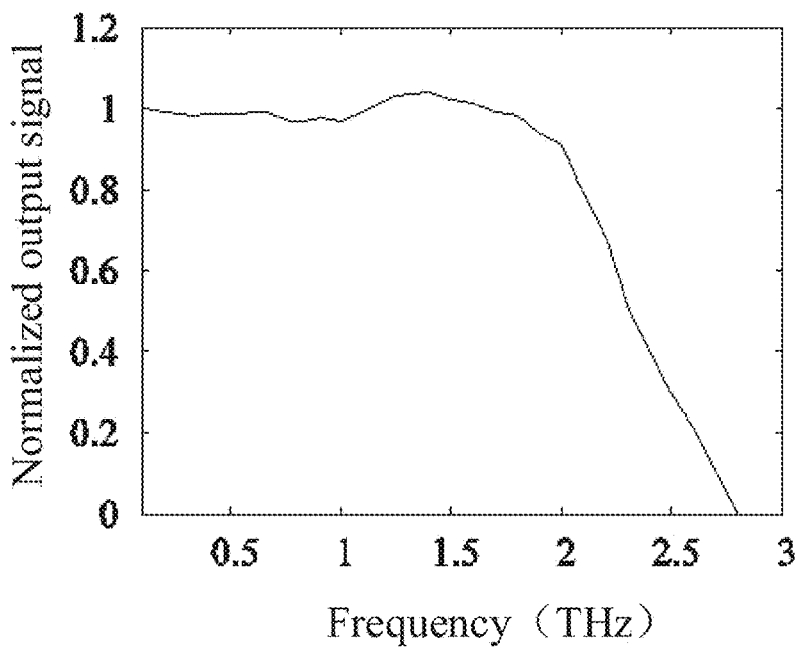
FIG. 4 is a variation diagram of working characteristic input signals along with the frequency when the current carrying channels are quasi-one-dimensional, obtained in Monte-Carlo simulation.

Referring to FIG. 3 and FIG. 4, through Monte Carlo simulation, the working characteristics of the frequency multiplier at room temperature can be obtained when the semiconductor conducting layer is of AlGaN/GaN heterojunction structure. In the simulation, the semiconductor conducting layer employs a structure with the following characteristics: the length of the current carrying channels is 400 nm; the width is 50 nm; the width of the insulating carving groove between the current carrying channels is 200 nm; and the dielectric constant is 12. FIG. 3 displays the output characteristics of the frequency multiplier by the effect of the two high frequency signals. On condition of t<20 ps, the first inlet electrode 21 and the second inlet electrode 22 both have no signal input, and the output current of the outlet electrode 23 is zero. In this simulation, a sinusoidal AC signal with amplitude of −5V, a period of 2.5 ps corresponding to frequency of 0.4 THz is used as the input signal of the first inlet electrode 21. When t=20 ps, the above input signals applied to the first inlet electrode 21, and then the outlet electrode 23 outputs an oscillating current with a period of 2.5 ps. A sinusoidal AC signal with an amplitude of −5V and a period of 2.5 ps is applied to the second inlet electrode when t=26.25 ps, while the outlet electrode 23 outputs an oscillating current with a corresponding frequency of 0.8 THz in a period of 1.25 ps. It can be seen that, by the effect of the two signals both with the frequency of 0.4 THz, the signal with a frequency of 0.8 THz is output, achieving the frequency multiplication. Besides, from FIG. 3 it can be seen that the time average of the output AC signal is no longer zero, which indicates that the structure in this embodiment can also be used for rectification of the high frequency signals. FIG. 4 shows the variation of the amplitude of the output frequency multiplying oscillating current along with the input signal frequency, wherein the output signal under the condition when the input signal is 0.1 THz is used as the denominator for normalization. From the simulating results, at room temperature the working cutoff frequency i.e. the frequency of the input signal of the present invention can be obtained, which is approximately 2.5 THz. The output signal is twice the input signal, so the cutoff frequency of the output signal is approximately 5 THz.

Embodiment 2: In this embodiment, the semiconductor conducting layer employs the two-dimensional semiconductor material.

Figure 5:
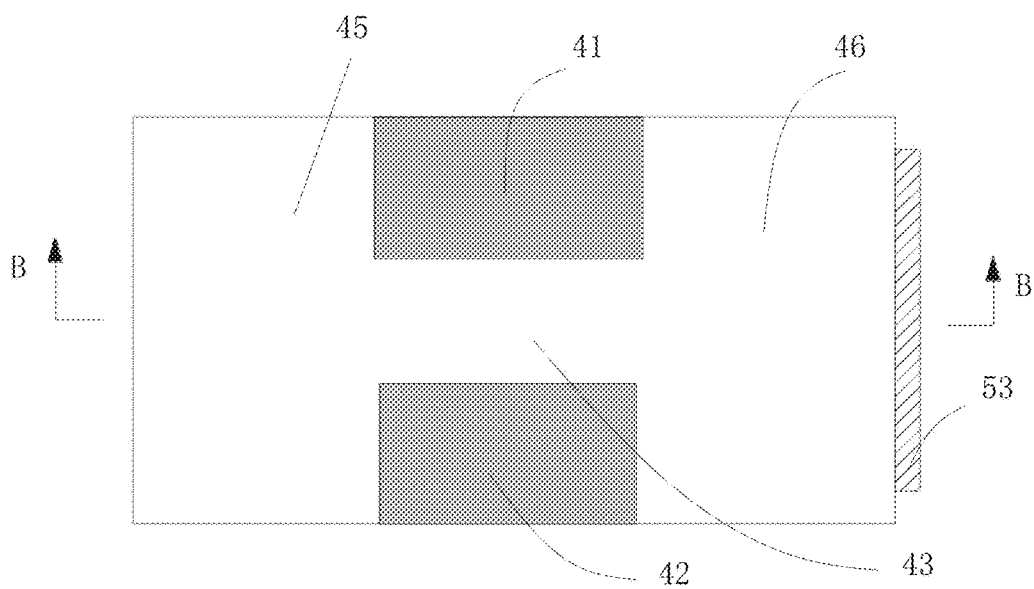
FIG. 5 is a schematic diagram of the surface of a frequency multiplier with two-dimensional current carrying channels in the second embodiment.
Figure 6:
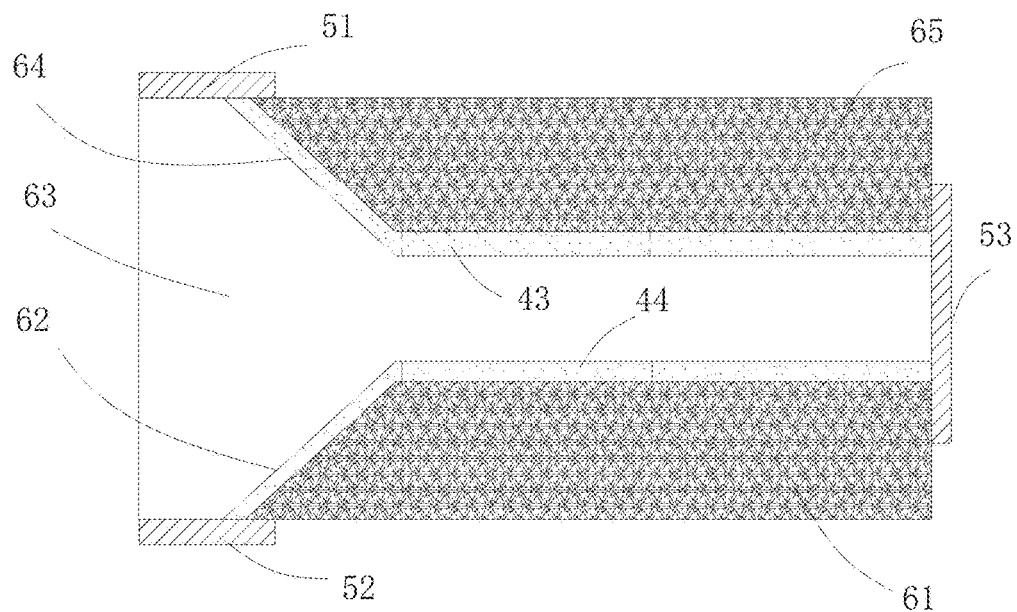
FIG. 6 is a sectional view taken along line A-A of FIG. 5.

Referring to FIG. 5, this is a schematic diagram of the surface of the frequency multiplier with two-dimensional current carrying channels. The first insulating carving groove 41 and the second insulating carving groove 42 are oppositely arranged. The space between the first insulating carving groove 41 and the second insulating carving groove 42 forms the current carrying channels. The first low resistance area 45 is on one side of the first insulating carving groove 41, the current carrying channels, and the second insulating carving groove 42, and the second resistance low area 46 is on the other side. The first low resistance area 45 is connected with the second low resistance area 46 through the current carrying channel. Referring to FIG. 6, when the current carrying channel is two dimensional, the semiconductor structure of the frequency multiplier comprises the insulating substrate layer 61, the semiconductor conducting layer 62, the insulating interval layer 63, the second semiconductor conducting layer 64 and the insulating protective layer 65 arranged in sequence from the bottom to the surface. The insulating protective layer 65 or the insulating interval layer 63 is made of insulating material with a high dielectric constant, capable of strengthening the mutual coupling between the current carrying channels, so that the space between the channels can be greater than 1 µm while the output signal is not affected.

Referring to FIG. 6, this is a structural diagram of the two-dimensional frequency multiplier with two-dimensional current carrying channels. In this embodiment, the longitudinal structure of the frequency multiplier comprises, in sequence, the second inlet electrode 52, the insulating substrate layer 61, the semiconductor conducting layer 62, the insulating interval layer 63, the second semiconductor conducting layer 64, the insulating protective layer 65 and the first inlet electrode 51 in turn from the bottom up. Besides, on the right side is the outlet electrode 53 connected with the second semiconductor conducting layer 64 and the semiconductor conducting layer 62. In FIG. 6, the dotted line area of the second semiconductor conducting layer 64 is the first current carrying channel 43; the dotted line area of the semiconductor conducting layer 62 is the second current carrying channel 44; and the width of the insulating interval layer between the two current carrying channels is less than 1 µm. In order to facilitate the manufacturing of the electrodes and reduce the interelectrode capacitance, the left ends of the semiconductor conducting layer 62 and the second semiconductor conducting layer 64 are respectively bent towards the substrate and the device surface. In a top plane view, the device comprises, from the left to the right the first inlet electrode 51, the first low resistance area 45 connecting the first inlet electrode 51, the second inlet electrode 52 and the current carrying channel, the first current carrying channel 43, the second low resistance area 46 connecting the current carrying channel and the inlet electrode 53, and the outlet electrode 53. The depth of the first insulating carving groove 41 is required to penetrate the second semiconductor conducting layer 64, and the depth of the second insulating groove 42 is required to penetrate the semiconductor conducting layer 62.

The technical solutions of the above embodiments of the present invention are described in detail. In this text, specific examples are used to describe the principle and implementation mode of the present invention. The above embodiments are applicable to helping to understand the principle of the embodiments of the present invention. Meanwhile, for those ordinarily skilled in this field, changes may be made in the implementation modes and the application scope according to the embodiments of the present invention. In conclusion, the contents of the Description cannot be regarded as limit to the present invention.

What is claimed is:

1. A frequency multiplier based on a low dimensional semiconductor structure, comprising;
   an insulating substrate layer;
   a semiconductor conducting layer arranged on a surface of the insulating substrate layer;
   an insulating conducting layer arranged on a surface of the semiconductor conducting layer;
   an insulating carving groove penetrating the semiconductor conducting layer;
   an inlet electrode arranged on a side surface of the semiconductor conducting layer and an outlet electrode arranged on the other side surface corresponding to the inlet electrode;
   wherein the semiconductor conducting layer comprises two two-dimensional, quasi-one-dimensional, or one-dimensional current carrying channels close and parallel to each other, the two current carrying channels are separated by the insulating carving groove or an insulating interval layer;
   wherein the inlet electrode comprises a first inlet electrode and a second inlet electrode, the first inlet electrode and the second inlet electrode being electrically connected with the two current carrying channels, respectively.

2. The frequency multiplier based on a low dimensional semiconductor structure of claim 1, wherein a space between the two current carrying channels is less than 1 µm.

3. The frequency multiplier based on a low dimensional semiconductor structure of claim 1, wherein a dielectric constant of the insulating protective layer is higher than that of the semiconductor conducting layer.

4. The frequency multiplier based on a low dimensional semiconductor structure of claim 1, wherein the two current carrying channels are quasi-one-dimensional, the insulating carving groove comprises a first insulating carving groove and a second insulating carving groove which are symmetrically arranged and a third insulating carving groove arranged between the first insulating carving groove and the second insulating carving groove; wherein one end of the first insulating carving groove, one end of the second insulating carving groove, and one end of the third insulating carving groove respectively extend to a side surface of the conducting layer; wherein the inlet electrode and the outlet electrode are respectively arranged on opposite surfaces of the conducting layer; wherein the inlet electrode comprises a first inlet electrode arranged on the side surface of the conducting layer area surrounded by the first insulating carving groove and the third insulating carving groove, and the second inlet electrode arranged on the conducting layer area surrounded by the second insulating carving groove and the third insulating carving groove and on the same side of surface where the first inlet electrode is located.

5. The frequency multiplier based on a low dimensional semiconductor structure of claim 4, wherein the semiconductor conducting layer is of AlGaN/GaN heterojunction, which comprises an AlGaN layer, a GaN layer, and a two-dimensional electron gas layer formed between the AlGaN layer and the GaN layer.

6. The frequency multiplier based on a low dimensional semiconductor structure of claim 4, wherein the semiconductor conducting layer is of AlGaAs/InGaAs heterojunction, which comprises an InGaAs layer, an AlGaAs layer, and a δ doping area arranged in the AlGaAs layer to result in a two-dimensional electron gas layer between the AlGaAs layer and the InGaAs layer.

7. The frequency multiplier based on a low dimensional semiconductor structure of claim 4, wherein a dielectric constant of the third insulating carving groove is higher than that of the semiconductor conducting layer.

8. The frequency multiplier based on a low dimensional semiconductor structure of claim 1, wherein the two current carrying channels are two-dimensional, an insulating interval layer and a second semiconductor conducting layer are also arranged in sequence between the insulating protective layer and the semiconductor conducting layer; wherein the structure of the frequency multiplier comprises the insulating substrate layer, the semiconductor conducting layer, the insulating interval layer, the second semiconductor conducting layer, and the insulating protective layer in sequence from the bottom to the surface.

9. The frequency multiplier based on a low dimensional semiconductor structure of claim 8, wherein one end of the semiconductor conducting layer bends and extends to a bottom surface of the insulating substrate layer; one end of the second semiconductor conducting layer bends and extends to the surface of the insulating protective layer; wherein the bending part of the semiconductor conducting layer is opposite to that of the second semiconductor conducting layer; wherein the inlet electrode comprises the first inlet electrode which is arranged on the bottom surface of the insulating substrate layer and connected with the bending part of the semiconductor conducting layer and the second inlet electrode arranged on the surface of the insulating protective layer and connected with the bending part of the second semiconductor conducting layer; wherein the output electrode is connected with the insulating protective layer, the second semiconductor conducting layer, the insulating interval layer, the semiconductor conducting layer, and the insulation protective layer.

\* \* \* \* \*